Figure 1:
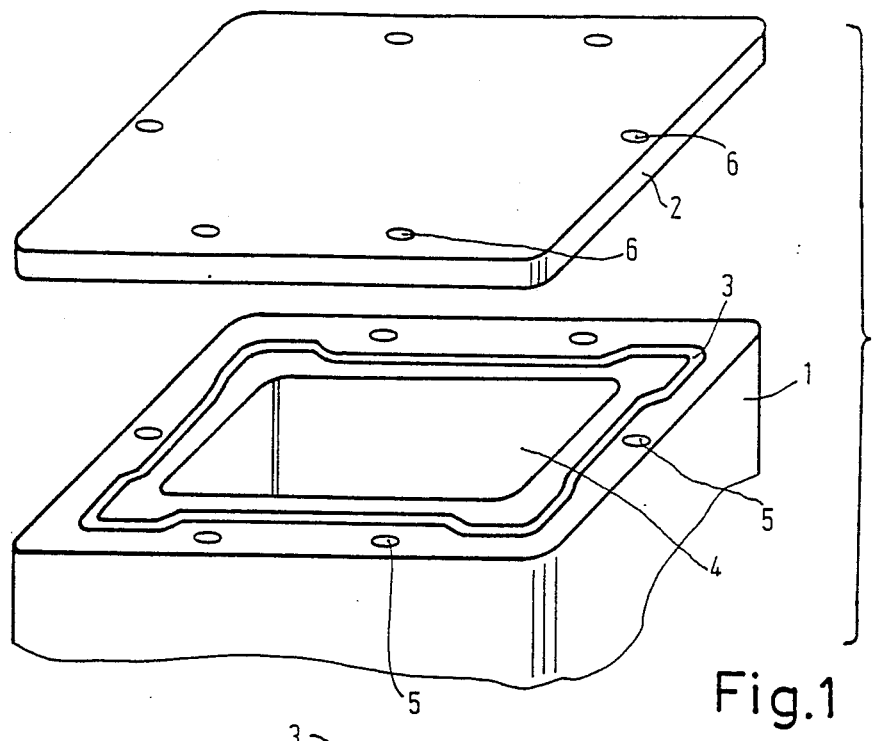

United States Patent [19]

Elsner et al.

[11] Patent Number: 4,841,102

[45] Date of Patent: Jun. 20, 1989

[54] ELECTROMAGNETIC SHIELDING ARRANGEMENT

[75] Inventors: Hans F. K. Elsner, Bremen; Peter W. Prendel, Weyhe; Wilfried H. K. Kandler, Achim; Jürgen Sandkuhl, Weyhe-Leeste, all of Fed. Rep. of Germany

[73] Assignee: U.S. Philips Corporation, New York, N.Y.

[21] Appl. No.: 151,771

[22] Filed: Feb. 3, 1988

[30] Foreign Application Priority Data

Feb. 7, 1987 [DE] Fed. Rep. of Germany ....... 3703787

[51] Int. Cl.$^4$ ...................... H05K 9/00; G12B 17/02; F16J 15/12; B65D 53/00

[52] U.S. Cl. .............................. 174/35 GC; 220/378; 277/189; 277/216

[58] Field of Search ........... 174/17 CT, 35 R, 35 GC, 174/35 MS, 50, 52 S; 361/424; 219/10.55 D; 220/3.8, 344, 378; 277/166, 189, 216, 220, 901; 49/486, 489; 200/302.1; 285/379

[56] References Cited

U.S. PATENT DOCUMENTS

| | | | |
|---|---|---|---|
| 529,033 | 11/1894 | Kato, Jr. | 220/378 |
| 1,630,675 | 5/1927 | Sinclair | 220/378 |
| 1,653,884 | 12/1927 | Straub | 220/378 |
| 1,831,641 | 11/1931 | Skinner | 285/379 X |

FOREIGN PATENT DOCUMENTS 3101519  7/1986  Fed. Rep. of Germany ........ 174/35 GC Primary Examiner—Laramie E. Askin

[57] ABSTRACT

A shielding string comprising at least at its surface a wire texture is arranged in a groove between the surfaces of two juxtaposed parts of a housing for electronic apparatus in order to attain a sealing for high frequency. This shielding string is cut accurately to size from a longer piece, while at the cutting areas loose wire parts of the texture can be formed, which, after the shielding string has been arranged, can fall into the housing containing the electronic circuit and can give rise there to short circuits. In order to avoid this, the ends of the shielding string are inserted into blind holes, which are provided in the groove. The groove can be widened in the area of the blind holes so that the two ends of the shielding string extend in parallel over a short distance. In order that the ends can be more readily fixed and the wire ends are kept from falling out, the blind holes can be provided with an adhesive.

4 Claims, 1 Drawing Sheet

U.S. Patent

Jun. 20, 1989

4,841,102

ELECTROMAGNETIC SHIELDING ARRANGEMENT

The invention relates to a shielding arrangement comprising a standard elastic shielding body having a substantially constant cross section, which is arranged between two housing parts in a groove formed in the surface of one of the housing parts.

Such shielding arrangements are used to shield high frequency housings containing electronic circuits. The standard soft elastic shielding body usually consists continuously of a strand of a wire texture or of a hose of wire texture applied to a strand of elastic material. Such a shielding body is usually cut off accurately to size from a longer piece and is then arranged in the groove of the one housing part. When a shielding body of wire texture is cut off, free lengths of wire are formed at the cutting edges, which are initially still held in the surrounding texture, but which can be detached in an uncontrollable manner and then can reach the interior of the housing containing an electronic circuit, where they can give rise to short circuits. This may also take place when the housing was already closed and must be opened later for maintenance or repair purposes because also in this case free wire ends can still be detached from the texture.

The invention has for its object to provide a shielding arrangement of the kind mentioned in the opening paragraph, in which it is prevented in a reliable manner that free wire ends can be detached from the cutting ends of the shielding body of wire texture.

This object is achieved in that the two ends of the shielding body are each inserted into a blind hole and located at the area of the groove directed perpendicularly to the surface of the one housing part.

By the measure according to the invention, any free wire ends being detached are held in the blind hole and thus can no longer reach the interior of the housing.

Frequently, shielding arrangements are used having a groove in the form of a closed ring so that at each point a shielding for high frequency is obtained. In this case, according to an embodiment of the invention, it is efficacious that the blind holes are formed in the groove immediately behind each other. The inserted ends of the shielding body then touch each other and lead to a transition between the two ends of the shielding body which is high frequency shielded to the greatest possible extent. However, according to another embodiment of the invention, a further improvement is characterized in that the groove is widened in a region to approximately double the cross-section and a blind hole is formed each time approximately at both ends of the region, while the shielding body is arranged in the groove so that the two ends in the region are located beside each other. Due to the fact that the ends of the shielding body in the region are arranged beside each other, a hiatus in the ring constituted by the shielding body is avoided with certainty.

In order that on the one hand the shielding body can be arranged in the groove and held therein in a simpler manner and that on the other hand it can be realized in an even more reliable manner that no loose wire ends are detached from the cutting areas of the shielding body and are passed to the exterior of the blind holes, it is efficacious that, before the ends of the shielding body are inserted, the blind holes are provided with an adhesive. More particularly with the use of a sufficient quantity of a substantially liquid adhesive, all the loose wire ends, if any, are then fixed.

Figure 2:
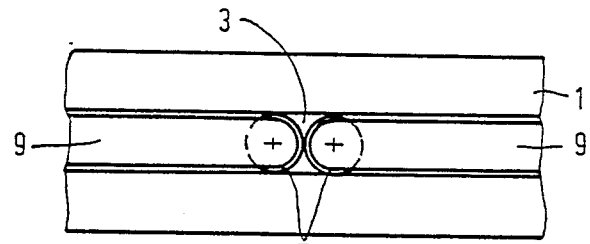
Figure 3:
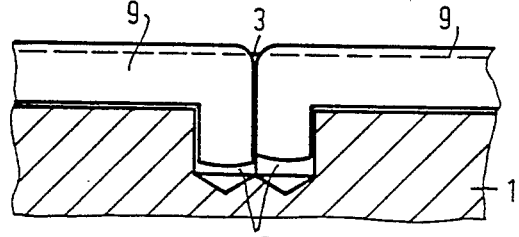
Figure 4:
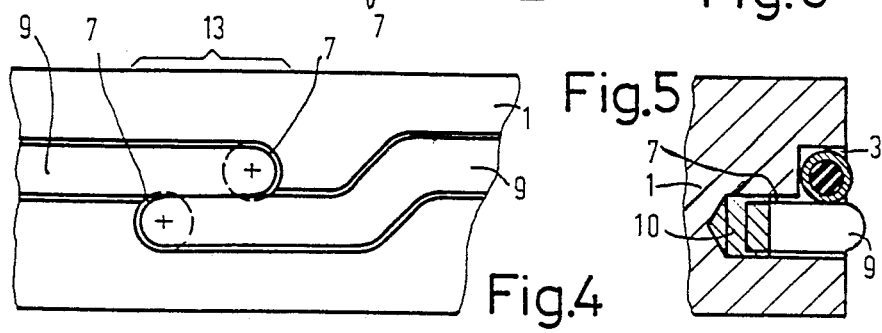
Figure 5:
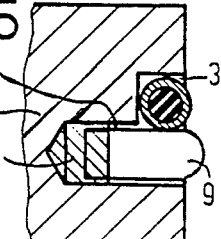

In order that the invention may be readily carried out, it will now be described more fully, by way of example, with reference to the drawing, in which:

FIG. 1 shows two housing parts having a groove for receiving the shielding body in one housing part, FIG. 2 shows the area of the groove at which the ends of the shielding body are inserted into blind holes, FIG. 3 is a longitudinal sectional view of the groove at this area, FIG. 4 shows the region of the groove in which the two ends of the shielding body are guided over a given distance beside each other and are then inserted into blind holes, FIG. 5 is a cross-section of this region.

FIG. 1 shows the region of a housing part 1 on which a cover 2 is to be secured. This is effected by means of screws through holes 6 in the cover, which are screwed, for example, into threaded bores 5. In the open region 4 of the housing part 1, an electronic circuit arrangement (not shown) is incorporated.

The surface of the housing part 1 is provided with a groove 3, for example by milling, which extends around the whole edge of the housing part 1 as a closed ring. A strand of conductive gauze wire is disposed as a shielding body in this groove 3, which body projects above the surface of the housing part 1 so that, when the cover 2 is secured by screwing, electrically conducting connections are established between the housing part 1 and the cover 2 both consisting of electrically conductive material through the shielding body at a large number of points at a small relative distance. As a result, shielding for high frequency is guaranteed.

The shielding body, which is arranged in the groove 3, consists of a strand of wire texture or of a strand of soft elastic material coated with a hose of wire texture. This strand is cut accurately to size from a longer piece and is arranged in the groove. FIG. 2 shows an example for the formation of the groove at the area at which the two cutting ends of the shielding body 9 meet in the groove 3 in the housing part 1; at this area two blind holes 7 are formed in the groove 3, into which holes the two ends of the shielding body 9 are inserted. This can be seen still more clearly in the longitudinal sectional view of the groove 3 shown in FIG. 3.

If the two ends of the shielding body 9 are inserted into the blind holes 7 so as to be kinked very abruptly, they touch each other up to a height extending approximately up to the edge of the groove 3 so that, when the cover is arranged, substantially no hiatus can occur in the shield.

However, if such a hiatus should be avoided in a very reliable manner, an embodiment can be used as shown in FIG. 4. In this Figure, the groove 3 is widened in a region 13 to substantially double the cross-section in that the straight part of the groove 3 is guided along the lefthand part of the groove so as to be relatively offset by approximately once the width of the groove. As a result, the two ends of a disposed shielding body 9 are guided in the region 13 in parallel and they terminate each in a blind hole 7 at the ends of this region. This region can also be formed in that the direction of the left hand groove is kinked upwards and the direction of the right hand groove is kinked downwards in the region 13. It is essential that in the region 13 due to the shape of the groove 3 the two ends of the shielding body are guided at least over a short distance immediately in parallel so that these two ends touch each other and overlap each other. The cross-section of the region 13 and the one blind hole 7 illustrated in FIG. 5 clearly shows how the two ends of the shielding body 9 touch each other.

In order that the sealing body 9 can be more readily fixed in the groove 3, i.e. in order to prevent that the ends of the shielding body 9 slide out of the blind holes before the cover is provided, and in order to achieve at the same time that loose wire parts from the cutting areas of the shielding body 9 can reach the surface of the housing part 3, the blind hole 7 is provided in the region 10 with an adhesive, which holds the ends of the shielding body 9 and simultaneously also any loose wire parts in the blind hole 7.

What is claimed is:

1. A shielding arrangement comprising a stranded elastic shielding body having a substantially constant cross-section, which body is arranged between two housing parts in a groove provided in the surface of one of the housing parts, characterized in that the two ends of the shielding body are each inserted into a blind hole directed perpendicularly to the surface of the one housing part and located in the groove.

2. A shielding arrangement as claimed in claim 1, wherein said groove is in the form of a closed ring, and said blind holes are arranged in the groove immediately behind each other.

3. A shielding arrangement as claimed in claim 1, wherein said groove is in the form of a closed ring that is widened in a region to approximately double its cross-section and one of said blind holes is formed at each end of the region, and the shielding body is arranged in the groove in such a manner that the two ends lie in the region one beside the other.

4. A shielding arrangement as claimed in any one of claims 1 to 3, characterized in that the blind holes are provided with an adhesive into which the ends of the shielding body are inserted.

* * * * *